(12) United States Patent
Kim et al.

(10) Patent No.: US 12,532,434 B2
(45) Date of Patent: Jan. 20, 2026

(54) HEAT DISSIPATING DEVICE

(71) Applicant: KOREA ADVANCED INSTITUTE OF SCIENCE AND TECHNOLOGY, Daejeon (KR)

(72) Inventors: Sung Jin Kim, Daejeon (KR); Young Jin Lee, Daejeon (KR); Juhyeon Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 116 days.

(21) Appl. No.: 18/570,891

(22) PCT Filed: Mar. 22, 2023

(86) PCT No.: PCT/KR2023/003780
§ 371 (c)(1),
(2) Date: Dec. 15, 2023

(87) PCT Pub. No.: WO2024/143707
PCT Pub. Date: Jul. 4, 2024

(65) Prior Publication Data
US 2025/0107042 A1 Mar. 27, 2025

(30) Foreign Application Priority Data

Dec. 26, 2022 (KR) .......................... 10-2022-0184022

(51) Int. Cl.
H05K 7/20 (2006.01)
(52) U.S. Cl.
CPC ..... H05K 7/20336 (2013.01); H05K 7/20327 (2013.01)

(58) Field of Classification Search
CPC .. H05K 7/20; H05K 7/20672; H05K 7/20327; H05K 7/20336; H01L 23/427; H01L 23/367; H01L 23/433
See application file for complete search history.

(56) References Cited

FOREIGN PATENT DOCUMENTS

| EP | 0510734 A1 | * | 10/1992 | ............ F28F 13/003 |
|---|---|---|---|---|
| JP | H05-283568 A | | 10/1993 | |
| KR | 20030012148 A | * | 2/2003 | |
| KR | 2022-0165054 A | | 12/2022 | |

OTHER PUBLICATIONS

Office Action issued on Feb. 10, 2023, in corresponding Korean Application No. 10-2022-0184022, 12 pages.

* cited by examiner

Primary Examiner — Harry E Arant
(74) Attorney, Agent, or Firm — Maier & Maier, PLLC

(57) ABSTRACT

A heat dissipating device. The heat dissipating device may include: a heat dissipating part having a heat dissipating structure formed on one surface thereof, the heat dissipating structure being configured to dissipate heat received from a heat source; and a fluid distributing part disposed on the one surface of the heat dissipating part and formed with an inlet configured to supply a fluid to the heat dissipating part and an outlet configured to discharge the fluid from the heat dissipating part. The heat dissipating structure may have a porous structure that draws the fluid from the inlet by capillary action.

13 Claims, 4 Drawing Sheets

HEAT DISSIPATING DEVICE

TECHNICAL FIELD

The present disclosure relates to a heat dissipating device. More specifically, the present disclosure relates to a heat dissipating device that enhances cooling performance by efficient fluid supply and vapor venting.

BACKGROUND

The world has entered an era of hyperconnectivity and superintelligence with the advent of the Fourth Industrial Revolution. These changes have been made possible by the advancement in computing technology and information and communication technology. The technological progress has been accompanied by the ultra-integration of IGBT, RF, and GaN devices, and the heat flux of electronic devices has exceeded 1,000 W/cm$^2$. Furthermore, as SiP (System in Package) is applied to stack electronic devices in 3D to increase the space utilization within the package, the heat flux is expected to rapidly increase to 1,500 W/cm$^2$ within the next five years. Accordingly, there is a demand for the development of a heat dissipating device with high thermal performance.

FIGS. 1 and 2 illustrate a heat dissipating device in accordance with the conventional art.

Referring to FIG. 1, it is common in the conventional heat dissipating device to install a plurality of heat dissipating fins 12 in a row on one surface of an electronic device 10 and allow a fluid to pass therethrough to perform cooling.

Referring to FIG. 2, in the conventional heat dissipating device, the temperature becomes higher as the fluid flows from the inlet to the outlet of the fluid, and thus the temperature distribution of the electronic device 10 is not uniform from the inlet to the outlet.

Meanwhile, although two-phase flow-based heat dissipating devices have been proposed to overcome the above-described limitation in cooling performance, there still remains a limit to the heat flux that can be cooled, due to the fact that the flow instability inherent in the two-phase flow cannot be controlled. Specifically, vapor bubbles are generated at portions where heat is generated in the two-phase flow-based heat dissipating device, and if vapor bubbles are not vented, a vapor blanket is formed to block the liquid supply from the surroundings to the heated surface, thereby resulting in a local dry-out. This leads to a rapid temperature rise, ultimately leading to device failure and decreased reliability.

SUMMARY

An object of an embodiment of the present disclosure is to provide a heat dissipating device that enhances heat dissipation performance through efficient supply of fluid and vapor venting.

An aspect of the present disclosure provides a heat dissipating device including: a heat dissipating part having a heat dissipating structure formed on one surface thereof, the heat dissipating structure being configured to dissipate heat received from a heat source; and a fluid distributing part disposed on the one surface of the heat dissipating part and formed with an inlet configured to supply a fluid to the heat dissipating part and an outlet configured to discharge the fluid from the heat dissipating part, wherein the heat dissipating structure has a porous structure that draws the fluid from the inlet by capillary action.

In this case, the fluid in liquid phase is supplied to the heat dissipating structure, and the fluid absorbs heat and vaporizes in the heat dissipating structure. The porous structure of the heat dissipating structure draws the fluid in liquid phase thereinto by capillary action and the vaporized fluid is vented out of the heat dissipating structure.

In this case, the pores of the porous structure disposed in the center of the heat dissipating structure may have a smaller diameter than the pores of the porous structure disposed in the outer peripheral part, and the fluid in liquid phase may be drawn in the center of the heat dissipating structure, and the vaporized fluid may be vented in the outer peripheral part of the heat dissipating structure.

In this case, the heat dissipating structure may include: a first porous material part disposed in the center of the heat dissipating structure and having a plurality of pores formed therein, the plurality of pores being configured to draw in the fluid from the inlet by capillary action; and a second porous material part disposed around the first porous material part and having a plurality of pores formed therein, the plurality of pores having a larger diameter than the plurality of pores of the first porous material part.

The heat dissipating structure may further include a third porous material part disposed around the second porous material part and having a plurality of pores formed therein, the plurality of pores having a larger diameter than the plurality of pores of the second porous material part.

Moreover, the heat dissipating structure may have a downward-sloping inclination formed on the outer peripheral part of the heat dissipating structure.

Moreover, the size of the pores of the porous structure in the heat dissipating structure may be adjusted based on the porosity between sintered particles or the spacing between the fins formed by an etching process.

Meanwhile, the fluid distributing part is formed with an inlet path for receiving the fluid and an outlet path for discharging the fluid, wherein the inlet path is formed with the inlet that is open toward one surface of the heat dissipating part, and the outlet path is formed with the outlet that is open toward the one surface of the heat dissipating part. The fluid supplied to the fluid distributing part may be supplied to the heat dissipating structure through the inlet of the inlet path to absorb heat and then may be discharged through the outlet of the outlet path.

The fluid distributing part may have a stacked structure on the one surface of the heat dissipating part, and the fluid distributing part may include a partition wall dividing the inlet path from the outlet path and may have a structure in which bottom surfaces of the inlet path and the outlet path are penetrated so as to form the inlet and the outlet.

The fluid distributing part may be provided with a plurality of the inlet path and a plurality of the outlet path, the plurality of inlet paths and the plurality of outlet paths may be alternately arranged.

The partition wall may be formed in a zigzag structure to divide the plurality of inlet paths and the plurality of outlet paths.

In the inlet path, the inlet may be formed to be disposed on the heat dissipating structure.

In the outlet path, the outlet may be formed to be disposed in between the heat dissipating structures.

Moreover, the heat dissipating part may include a heat dissipating plate having the heat dissipating structure formed on one surface thereof and an electronic device attached to the other surface thereof.

The fluid distributing part may have a plate-shaped structure corresponding to the heat dissipating plate and may be attached to the one surface of the heat dissipating plate.

According to an embodiment of the present disclosure, by utilizing two-phase flow, it is possible to absorb a high amount of heat through the vaporization of liquid and any generated vapor bubbles are smoothly vented, thereby ensuring high heat dissipation performance.

Moreover, vapor bubbles generated in the heat dissipating structure may be smoothly vented, thereby preventing the formation of a vapor blanket in the heat dissipating structure.

DETAILED DESCRIPTION

Figure 1:
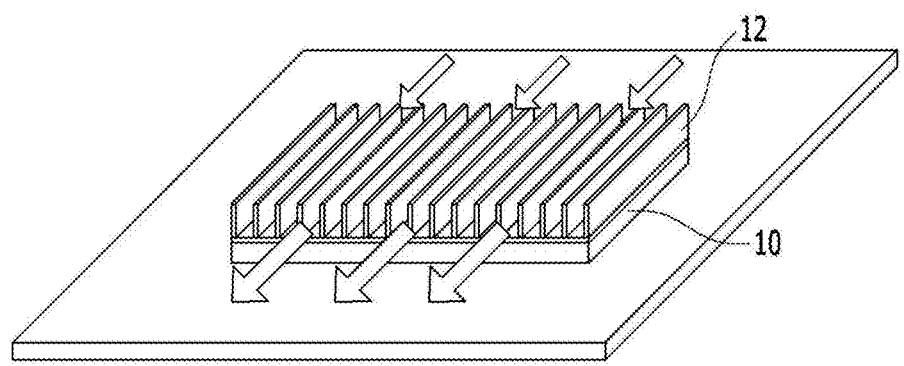
FIG. 1 illustrates a heat dissipating device in accordance with the conventional art.
Figure 2:
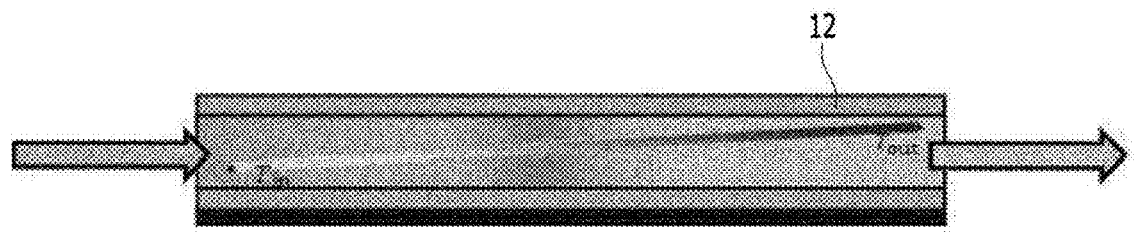
FIG. 2 illustrates a heat dissipating device in accordance with the conventional art.

The terms used in the present disclosure intended to describe a certain embodiment of the present disclosure and not to limit the present disclosure to those terms. Any singular expressions include plural expressions, unless deemed to mean otherwise.

When a component is described to "include" or "comprise" an element, it shall be understood to mean that the component may further include another element, rather than excluding another element, unless otherwise described. Moreover, throughout the specification, when it is described to be "on" an object, it shall be understood to be above or below said object, and not necessarily above said object in a gravitational direction.

When an element is described to be "connected" or "coupled" to another element, it shall include not only the case of said element physically being connected or coupled to the other element but also the case of said element indirectly being connected or coupled to the other element by way of yet another element interposed between said element and the other element.

While terms such as "first" and "second" may be used to describe various elements, these elements shall not be limited by these terms. Rather, these terms are used solely for the purpose of distinguishing one element from another element.

The size and thickness of each element shown in the drawings are illustrated for the convenience of description, and the present disclosure shall not be limited to the illustrated size and thickness.

Hereinafter, an embodiment of the present disclosure will be described with reference to the accompanying drawings. In describing the present disclosure with reference to the accompanying drawings, identical or corresponding elements will be given identical reference numerals and will not be redundantly described.

Figure 3:
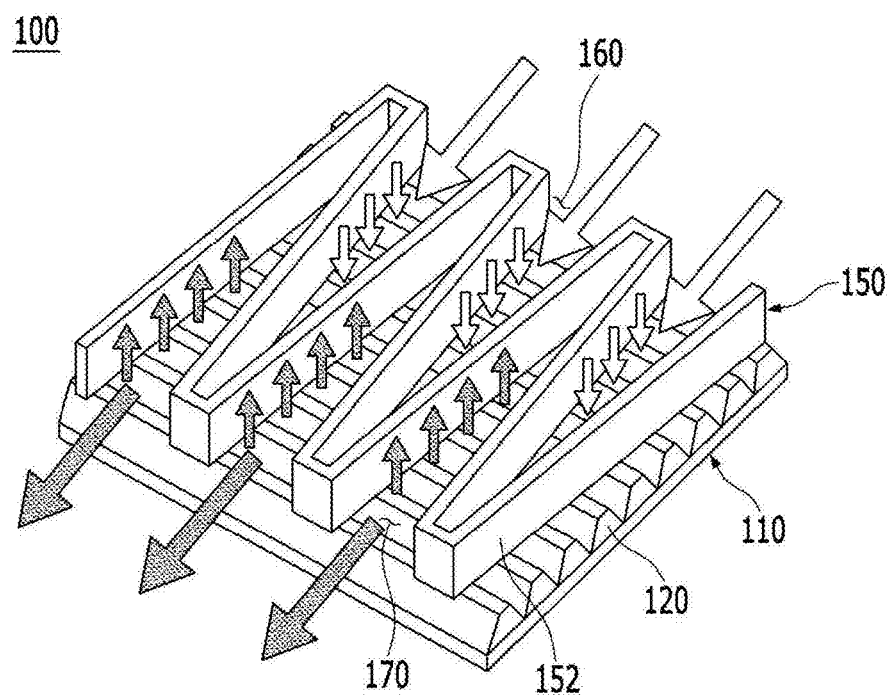
FIG. 3 illustrates a heat dissipating device in accordance with an embodiment of the present disclosure.
Figure 4:
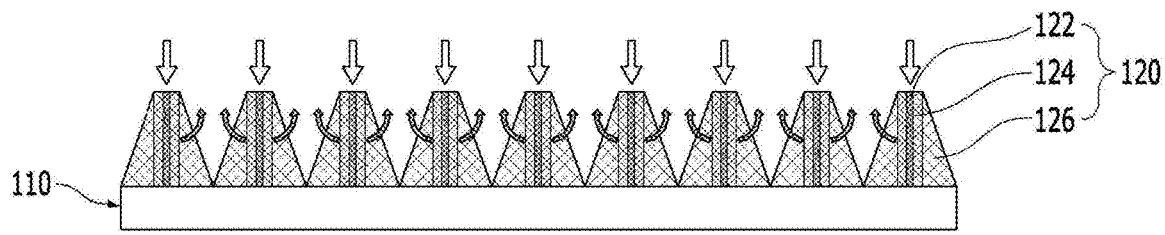
FIG. 4 illustrates the heat dissipating device in detail in accordance with an embodiment of the present disclosure.
Figure 5:
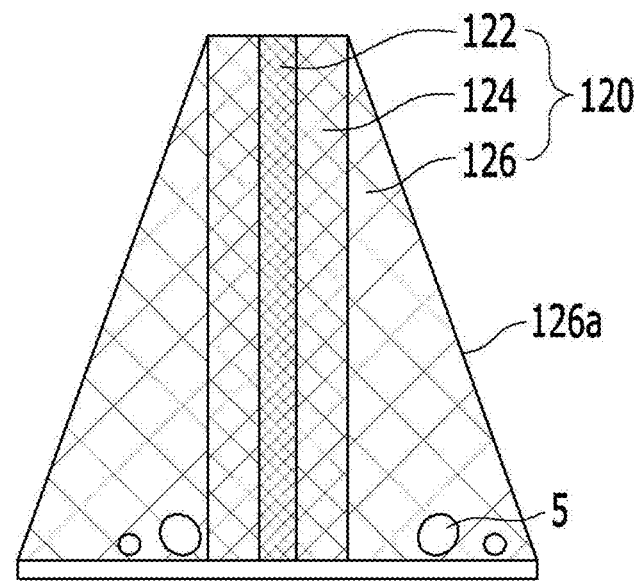
FIG. 5 illustrates the heat dissipating device in detail in accordance with an embodiment of the present disclosure.
Figure 6:
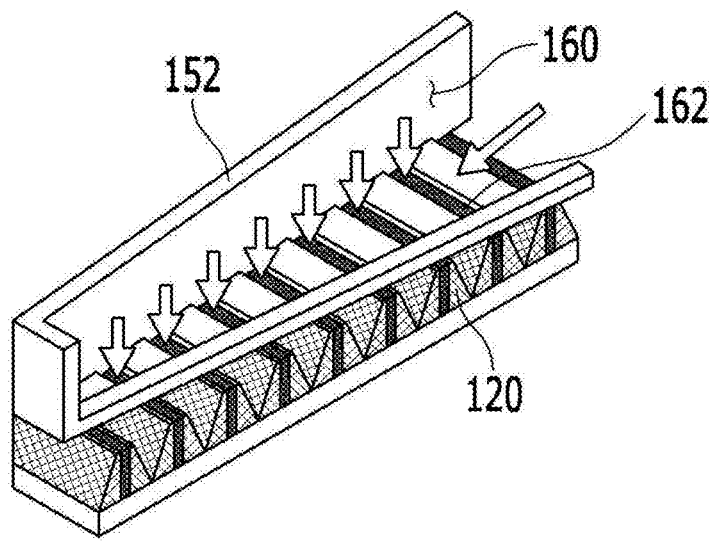
FIG. 6 illustrates the heat dissipating device in detail in accordance with an embodiment of the present disclosure.
Figure 7:
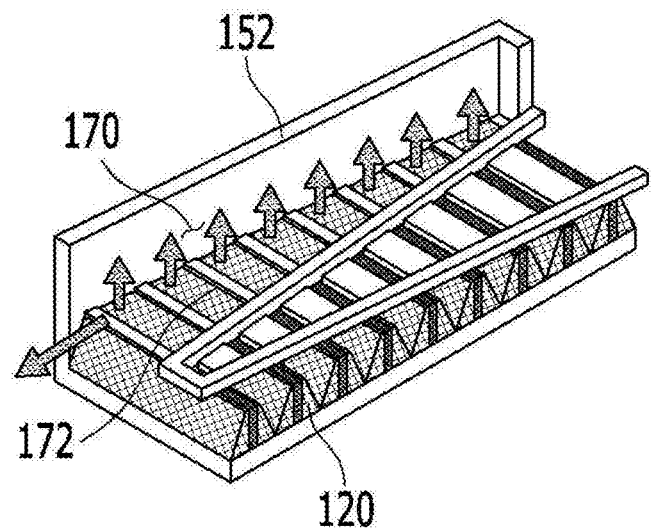
FIG. 7 illustrates the heat dissipating device in detail in accordance with an embodiment of the present disclosure.

FIG. 3 illustrates a heat dissipating device in accordance with an embodiment of the present disclosure, and FIGS. 4 to 7 illustrate the heat dissipating device in detail in accordance with an embodiment of the present disclosure. Specifically, FIG. 4 is a detailed illustration of a heat dissipating part of the heat dissipating device in accordance with an embodiment of the present disclosure, and FIG. 5 is a detailed illustration of a heat dissipating structure of the heat dissipating part, and FIG. 6 is a detailed illustration of a path of fluid entering in a fluid distributing part, and FIG. 7 is a detailed illustration of a path of fluid being discharged.

Referring to FIG. 3, a heat dissipating device 100 in accordance with an embodiment of the present disclosure includes a heat dissipating part 110 and a fluid distributing part 150.

The heat dissipating part 110 receives heat from a heat source (e.g., an electronic device) and dissipates the received heat to an outside. The heat dissipating part 110 has a heat dissipating structure 120 for radiating the received heat formed on one surface thereof.

Particularly, in the heat dissipating part 110 of the present embodiment, the heat dissipating structure 120 has a porous structure that utilizes capillary action to draw in fluid at an inlet 162. Accordingly, the fluid in liquid phase may be supplied to the heat dissipating structure 120, and the fluid may absorb heat and vaporize in the heat dissipating structure 120. In such a case, the porous structure of the heat dissipating structure 120 may continuously draw the fluid in liquid phase inwards with capillary action and the vaporized fluid is vented out of the heat dissipating structure 120.

Therefore, vapor bubbles generated in the heat dissipating structure 120 may be smoothly vented, thereby preventing the formation of a vapor blanket in the heat dissipating structure 120. That is, while a high amount of heat is absorbed owing to vaporization of liquid based on two-phase flow, any generated vapor bubbles may be smoothly vented, thereby obtaining high heat dissipation performance.

The porous structure of the heat dissipating structure 120 may be formed by sintering particles, and the pore size may be configured by adjusting the porosity between the sintered particles. Moreover, the porous structure in the heat dissipating structure 120 may be formed in a fin structure by an etching process, and the pore size may be adjusted with the spacing between the fins.

Referring to FIGS. 4 and 5, the heat dissipating structure 120 of the present embodiment, the pores of the porous structure disposed in the center are formed with a smaller diameter than the pores of the porous structure disposed in the outer peripheral part. In the center of the heat dissipating structure 120 in which the pores are formed small enough to cause capillary action, the fluid in liquid phase may be drawn in. For example, the size of the pores in the center of the heat dissipating structure 120 may be set to 1 to 100 microns (μm) to generate a capillary effect. In the outer peripheral part of the heat dissipating structure 120 in which the pores are formed larger than the center part, the vaporized fluid may be readily vented. The fluid drawn into the center by the capillary effect may push the gas 5 in the outer peripheral part while moving to the outer peripheral part having relatively large pores. Here, since the outer peripheral part is a porous structure with relatively large pores, the gas 5 may easily pass through the outer peripheral part and be vented to the outside.

Specifically, the heat dissipating structure 120 of the present embodiment may have a two-stage porous structure, including: a first porous material part 122 disposed in the center and having a plurality of pores that draw in the liquid from the inlet 162 by capillary action; and a second porous material part 124 disposed around the first porous material part 122 and having a plurality of pores formed with a larger diameter than the first porous material part 122.

Moreover, the heat dissipating structure 120 may have a three-stage porous structure, further including a third porous material part 126 disposed around the second porous material part 124 and having a plurality of pores formed with a larger diameter than the second porous material part 124.

Meanwhile, although the present embodiment illustrates a structure in which the size of the pores in the heat dissipating structure 120 changes stepwise (discontinuously), the present disclosure is not limited to this structure, and it shall be appreciated that a structure in which the size of the pores in the heat dissipating structure 120 changes continuously is also included in the present disclosure.

Moreover, the heat dissipating structure 120 of the present embodiment may have a downward-sloping inclination formed at the outer peripheral part. For example, in the heat dissipating structure 120 of the present embodiment, the outer surface of the third porous material part 126 may have an inclined surface 126a that becomes wider downwardly. Accordingly, when the gas 5 generated in the lower side of the heat dissipating structure 120 is elevated, the gas 5 may be directly vented to the outside even in the middle of the heat dissipating structure 120 due to the inclined surface 126a.

The fluid distributing part 150 forms a path for supplying and discharging a fluid to and from the heat dissipating part 110 such that heat dissipation is effectively achieved. The fluid distributing part 150 is disposed on one surface of the heat dissipating part 110 and is formed with an inlet 162 for supplying a fluid to the heat dissipating part 110 and an outlet 172 for discharging a fluid from the heat dissipating part 110.

The fluid distributing part 150 of the present embodiment is disposed on one surface of the heat dissipating part 110 in which the heat dissipating structure 120 is formed and is formed with an inlet path 160 for receiving the fluid and an outlet path 170 for discharging the fluid.

Here, the inlet path 160 may be formed with an inlet 162 that is open towards one surface of the heat dissipating part 110. Accordingly, a path for supplying the fluid in an advantageous position for heat transfer may be formed on one surface of the heat dissipating part 110. Moreover, a path for supplying the fluid divided into several positions may be easily formed on one surface of the heat dissipating part 110.

Moreover, the outlet path 170 may be formed with an outlet 172 that is open towards one surface of the heat dissipating part 110. Accordingly, a path for directly discharging the fluid to which heat has been transferred may be formed in the heat dissipating part 110. Moreover, a path for dividing and discharging the fluid may be easily formed at several positions on one surface of the heat dissipating part 110.

Accordingly, the fluid supplied to the fluid distributing part 150 may be supplied to the heat dissipating structure 120 of the heat dissipating part 110 through the inlet 162 of the inlet path 160 to absorb heat and may be discharged to the fluid distributing part 150 through the outlet 172 of the outlet path 170.

Referring to FIGS. 3, 6 and 7, the fluid distributing part 150 of the present embodiment may have a structure stacked on one surface of the heat dissipating part 110. When the heat dissipating part 110 has a structure in which a plurality of heat dissipating structures 120 are stood in parallel on one surface thereof, the fluid distributing part 150 may have a block structure that is directly stacked on top of the plurality of heat dissipating structures 120.

Here, the fluid distributing part 150 may be structured to have the inlet path 160 and the outlet path 170 divided by a partition wall 152. Accordingly, the cool fluid entering the heat dissipating part 110 and the hot fluid being discharged from the heat dissipating part 110 may be introduced and separated into separate paths.

Particularly, the fluid distributing part 150 may be provided with a plurality of inlet paths 160 and a plurality of outlet paths 170, whereas the plurality of inlet paths 160 and the plurality of outlet paths 170 may be arranged in an alternating structure. Accordingly, this allows for even distribution of the fluid to various locations within the heat dissipating part 110 and formation of the paths for dividing and discharging the fluid from the various locations.

Specifically, in the present embodiment, the partition wall 152 of the fluid distributing part 150 disposed over the heat dissipating part 110 may be formed in a zigzag structure so as to partition the plurality of inlet paths 160 and the plurality of outlet paths 170. Accordingly, the plurality of inlet paths 160 and the plurality of outlet paths 170 may be arranged alternately next to each other. Over a plurality of plate members, the partition wall 152 may be formed in zigzag directions across the plurality of plate members.

Here, the bottom surfaces of the inlet path 160 and the outlet path 170 may have a penetrated structure such that the inlet 162 and the outlet 172 to the heat dissipating part 110 are formed in the inlet path 160 and the outlet path 170.

Referring to FIG. 6, in the inlet path 160, the inlet d162 may be formed to be disposed on the heat dissipating structure 120. Accordingly, the heat dissipating structure 120 can draw in the fluid in liquid phase in the inlet path 160 through the inlet 162 using capillary action.

Referring to FIG. 7, in the outlet path 170, the outlet 172 may be formed to be disposed in between the heat dissipating structures 120. Accordingly, the gas and heated liquid discharged from the heat dissipating structure 120 may be discharged to the outlet path 170 through the outlet 172.

The inlet 162 and the outlet 172 are not limited to what is described herein, and the inlet 162 and the outlet 172 may take various forms, including, for example, penetrating the bottom surface of the fluid distributing part 150 entirely or partially.

Moreover, the fluid distributing part 150 may further include a lid for covering at least one of the inlet path 160 and the outlet path 170 such that the fluid in the inlet path 160 does not mix with the fluid in the outlet path 170.

Figure 8:
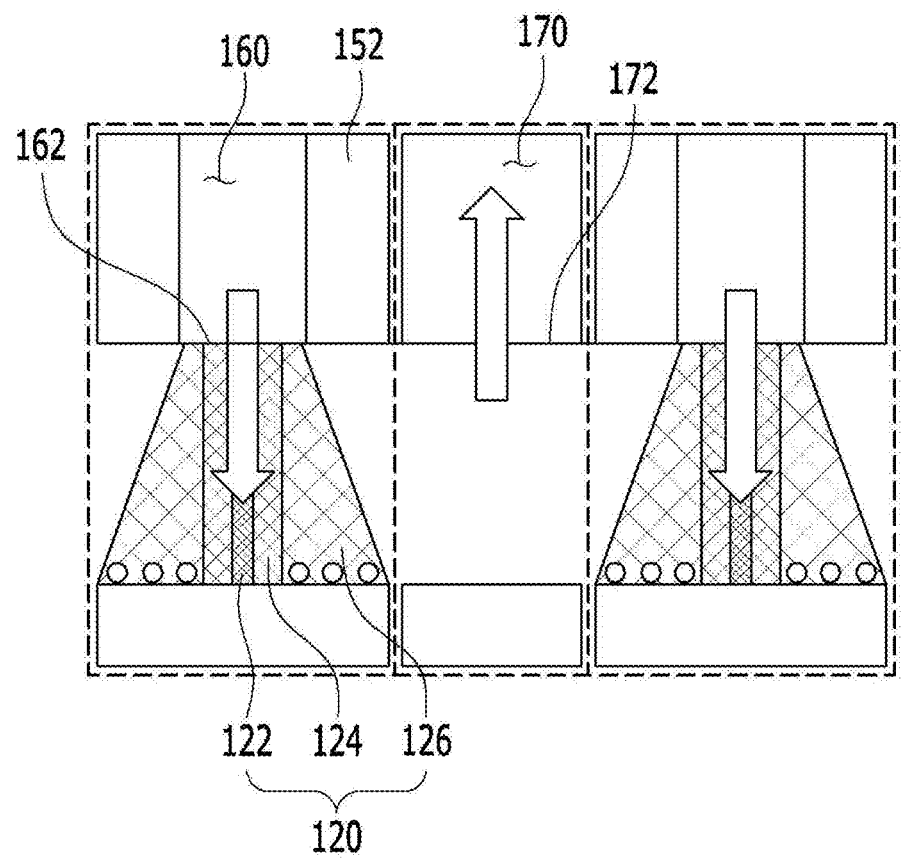
FIG. 8 illustrates a heat dissipating structure in the heat dissipating device in accordance with an embodiment of the present disclosure.

FIG. 8 illustrates the heat dissipating structure in the heat dissipating device 100 in accordance with an embodiment of the present disclosure.

Referring to FIG. 8, the heat dissipating structure 120 having a porous structure may draw in liquid in the inlet path 160 by capillary action. The liquid drawn into the heat dissipating structure 120 may receive heat from the heat dissipating structure 120 to partly vaporize, and the remaining liquid may be in a hot liquid state. Since the heat dissipating structure 120 continuously draws the liquid from the inlet path 160, the gas and the hot liquid generated therein may be pushed and vented to the outside by newly introduced liquid. Accordingly, the gas and the hot liquid may be gathered between the heat dissipating structures 120, and the fluid having arrived at the position of the outlet 172 disposed between the heat dissipating structures 120 may be moved upward and discharged through the outlet 172 at an upper part.

Therefore, according to the present embodiment, a structure may be formed to allow for dissipation of heat by having a cool fluid to be continuously supplied into the heat dissipating structure 120 with a porous structure and allowing the hot gas and the liquid having received heat from the heat dissipating part 110 to be rapidly discharged out of the heat dissipating part 110. Particularly, the path in which the gas generated by the heat is discharged is clearly established, and the outlet path 170 of the heated fluid is established to be the shortest, thereby preventing any stagnation of the heated fluid in the heat dissipating part 110.

The heat dissipating device 100 in accordance with the present embodiment may have a structure applicable to electronic devices. For example, the heat dissipating part 110 includes a heat dissipating plate having the heat dissipating structure 120, such as a plurality of plate members, formed on one surface thereof and an electronic device attached to the other surface thereof. In such a case, the fluid distributing part 150 may have a plate-shaped structure corresponding to the heat dissipating plate and may be attached to one surface of the heat dissipating plate.

Specifically, the heat dissipating plate may be formed of a Si substrate, and the heat dissipating structure 120 may be formed by etching one surface of the Si substrate. Moreover, the fluid distributing part 150 may be formed of a glass substrate attached to the heat dissipating plate, and the inlet path 160, the outlet path 170, the inlet 162 and the outlet 172 may be formed by etching the glass substrate.

Hitherto, while a preferred embodiment of the present disclosure has been described, any one of ordinary skill in the art to which the present disclosure pertains shall appreciate that any variety of permutations and/or modifications of the described embodiment are possible, without departing from the technical ideas of the present disclosure described in the appended claims, by supplementing, modifying, deleting or adding certain elements, and that such permutations and/or modifications are included in the claims of the present disclosure.

DESCRIPTION OF ELEMENTS

100: heat dissipating device
110: heat dissipating part
120: heat dissipating structure
122: first porous material part
124: second porous material part
126: third porous material part
126a: inclined surface
150: fluid distributing part
152: partition wall
160: inlet path
162: inlet
170: outlet path
172: outlet

What is claimed is:

1. A heat dissipating device comprising:
a heat dissipating part having a heat dissipating structure formed on one surface thereof, the heat dissipating structure being configured to dissipate heat received from a heat source; and
a fluid distributing part disposed on the one surface of the heat dissipating part and formed with an inlet configured to supply a fluid to the heat dissipating part and an outlet configured to discharge the fluid from the heat dissipating part,
wherein the heat dissipating structure has a porous structure that draws the fluid from the inlet by capillary action,
wherein the fluid in liquid phase is supplied to the heat dissipating structure, and the fluid absorbs heat and vaporizes in the heat dissipating structure,
wherein the porous structure of the heat dissipating structure draws the fluid in liquid phase thereinto by capillary action and the vaporized fluid is vented out of the heat dissipating structure,
wherein pores of the porous structure disposed in a center of the heat dissipating structure are formed with a smaller diameter than pores of the porous structure disposed in an outer peripheral part, and
wherein the fluid in liquid phase is drawn in the center of the heat dissipating structure, and the vaporized fluid is vented in the outer peripheral part of the heat dissipating structure.

2. The heat dissipating device according to claim 1, wherein the heat dissipating structure comprises:
a first porous material part disposed in the center of the heat dissipating structure and having a plurality of pores formed therein, the plurality of pores being configured to draw in the fluid from the inlet by capillary action; and
a second porous material part disposed around the first porous material part and having a plurality of pores formed therein, the plurality of pores having a larger diameter than the plurality of pores of the first porous material part.

3. The heat dissipating device according to claim 2, wherein the heat dissipating structure further comprises a third porous material part disposed around the second porous material part and having a plurality of pores formed therein, the plurality of pores having a larger diameter than the plurality of pores of the second porous material part.

4. The heat dissipating device according to claim 1, wherein the heat dissipating structure has a downward-sloping inclination formed on the outer peripheral part of the heat dissipating structure.

5. The heat dissipating structure according to claim 1, wherein the size of pores of the porous structure in the heat dissipating structure is adjusted based on porosity between sintered particles or spacing between fins formed by an etching process.

6. The heat dissipating device according to claim 1, wherein the fluid distributing part is formed with an inlet path for receiving the fluid and an outlet path for discharging the fluid, the inlet path being formed with the inlet that is open toward the one surface of the heat dissipating part, the outlet path being formed with the outlet that is open toward the one surface of the heat dissipating part, and
wherein the fluid supplied to the fluid distributing part is supplied to the heat dissipating structure through the inlet of the inlet path to absorb heat and then is discharged through the outlet of the outlet path.

7. The heat dissipating device according to claim 6, wherein fluid distributing part has a stacked structure on the one surface of the heat dissipating part, and
wherein the fluid distributing part comprises a partition wall dividing the inlet path and the outlet path and has a structure in which bottom surfaces of the inlet path and the outlet path are penetrated so as to form the inlet and the outlet.

8. The heat dissipating device according to claim 7, wherein the fluid distributing part is provided with a plurality of the inlet path and a plurality of the outlet path, and
wherein the plurality of inlet paths and the plurality of outlet paths are alternately arranged.

9. The heat dissipating device according to claim 8, wherein the partition wall is formed in a zigzag structure to divide the plurality of inlet paths and the plurality of outlet paths.

10. The heat dissipating device according to claim 8, wherein in the inlet path, the inlet is formed to be disposed on the heat dissipating structure.

11. The heat dissipating device according to claim 8, wherein in the outlet path, the outlet is formed to be disposed in between the heat dissipating structures.

12. The heat dissipating device according to claim 6, wherein the heat dissipating part comprises a heat dissipating plate having the heat dissipating structure formed on one surface thereof and an electronic device attached to the other surface thereof.

13. The heat dissipating device according to claim 12, wherein the fluid distributing part has a plate-shaped structure corresponding to the heat dissipating plate and is attached to the one surface of the heat dissipating plate.

* * * * *